(12) United States Patent
An et al.

(10) Patent No.: US 9,917,076 B2
(45) Date of Patent: Mar. 13, 2018

(54) LED PACKAGE

(71) Applicant: ALLIX CO., LTD., Jeonju (KR)

(72) Inventors: Jong Uk An, Jeonju (KR); Noh Joon Park, Jeonju (KR)

(73) Assignee: ALLIX CO., LTD., Jeonju, Jeollabuk-Do (KR)

( * ) Notice: Subject to any disclaimer, the term of this patent is extended or adjusted under 35 U.S.C. 154(b) by 0 days.

(21) Appl. No.: 15/370,837

(22) Filed: Dec. 6, 2016

(65) Prior Publication Data

US 2017/0365585 A1    Dec. 21, 2017

(30) Foreign Application Priority Data

Jun. 16, 2016 (KR) .................. 10-2016-0075012
Nov. 8, 2016 (KR) .................. 10-2016-0147969

(51) Int. Cl.
| H01L 33/00 | (2010.01) |
| H01L 25/075 | (2006.01) |
| H01L 33/54 | (2010.01) |
| H01L 33/50 | (2010.01) |
| H01L 33/64 | (2010.01) |

(52) U.S. Cl.
CPC ........ *H01L 25/0753* (2013.01); *H01L 33/502* (2013.01); *H01L 33/54* (2013.01); *H01L 33/644* (2013.01)

(58) Field of Classification Search
CPC ... H01L 25/0753; H01L 33/54; H01L 33/502; H01L 33/644
USPC .................................................... 257/89, 87
See application file for complete search history.

(56) References Cited

U.S. PATENT DOCUMENTS

| 7,569,987 | B2 | 8/2009 | Naitou |
| 8,558,268 | B2 | 10/2013 | Kim et al. |
| 9,196,653 | B2 | 11/2015 | Leatherdale et al. |
| 2008/0276393 | A1* | 11/2008 | Russell .............. A46B 7/00 15/105 |
| 2010/0128461 | A1 | 5/2010 | Kim et al. |
| 2010/0187549 | A1 | 7/2010 | Chen |
| 2011/0037083 | A1 | 2/2011 | Keung et al. |
| 2013/0334553 | A1 | 12/2013 | Yeh et al. |
| 2017/0062628 | A1* | 3/2017 | Shen .................. H01L 31/0203 |

(Continued)

FOREIGN PATENT DOCUMENTS

| JP | 2010-182878 | 8/2010 |
| JP | 5444654 B2 | 3/2014 |
| JP | 2015-053524 | 3/2015 |

(Continued)

OTHER PUBLICATIONS

Office Action for Korean Patent Application No. 10-2016-0075012, dated Aug. 19, 2017.

(Continued)

*Primary Examiner* — David S Blum
(74) *Attorney, Agent, or Firm* — Pearl Cohen Zedek Latzer Baratz LLP

(57) ABSTRACT

An LED package having a plurality of light emitting regions includes a plurality of LED chips. The LED package further includes a plurality of electrode portions on which each of the plurality of LED chips is mounted, and a package mold portion having a plurality of openings formed on one surface thereof so as to each emit light by the plurality of LED chips.

15 Claims, 8 Drawing Sheets

(56) References Cited

U.S. PATENT DOCUMENTS

2017/0147857 A1* 5/2017 Liu .................. G06K 9/00053

FOREIGN PATENT DOCUMENTS

| KR | 10-2006-0099567 | 9/2006 |
| KR | 10-2010-0044409 | 4/2010 |
| KR | 10-2013-0016815 | 2/2013 |
| KR | 10-2014-0056417 | 5/2014 |
| KR | 10-1399997 B2 | 5/2014 |
| KR | 2015-0107480 P | 9/2015 |

OTHER PUBLICATIONS

International Search Report of PCT Application No. PCT/KR2017/007628, dated Oct. 27, 2017.
Office Action for Korean Patent Application No. 10-2016-0147969, dated Nov. 29, 2017.

\* cited by examiner

LED PACKAGE

CROSS-REFERENCE TO RELATED APPLICATIONS

This application claims priority from Korean Patent Application No. 10-2006-0075012, filed Jun. 16, 2016, and Korean Patent Application No. 10-2016-0147969, filed Nov. 8, 2016, each of which is incorporated herein by reference in its entirety.

FIELD OF THE INVENTION

The present disclosure relates to an LED package, and more particularly, to an LED package having a plurality of light emitting regions.

BACKGROUND OF THE INVENTION

An LED (Light Emitting Diode) is a semiconductor device that can realize various colors by forming a light emitting source using compound semiconductor materials such as GaAs, AlGaAs, GaN, InGaN, AlGaInP, and so on. The LEDs are manufactured as a type of a surface mount device (SMD) directly mounted on a PCB in accordance with the trend of miniaturizing and slimming down devices. The LEDs of the SMD type are gradually replacing existing lighting devices and widening the extent of the use thereof.

SUMMARY OF THE INVENTION

In view of the forgoing, one or more embodiments of the present disclosure provides an LED package having a plurality of light emitting regions.

In accordance with an aspect of the present invention, there is provided an LED package, which includes: a plurality of LED chips; a plurality of electrode portions on which the plurality of LED chips is respectively mounted; and a package mold portion 10 having a plurality of openings formed on one surface thereof so as to radiate light of the plurality of LED chips.

Further, the plurality of openings may be arranged in parallel, the neighboring openings may be partitioned from each other by at least one partition, and the plurality of openings may be formed in planar shapes which are circular or polygonal.

In addition, the LED package may further include phosphors filled in the plurality of openings.

Further, the plurality of LED chips may include a first LED chip which is a blue LED chip, a second LED chip which is a green LED chip, a third LED chip which is a red LED chip, and a fourth LED chip which is a blue LED chip.

In addition, the LED package may further include phosphors filled in the plurality of openings, wherein the phosphor corresponding to the fourth LED chip emits white light of a color temperature range of 1,800 K to 20,000 K.

Further, the plurality of LED chips may be all blue LED chips, the plurality of LED chips may be all green LED chips, the plurality of LED chips may be all red LED chips, the plurality of LED chips may be all blue LED chips for emitting white light, or at least two of the plurality of LED chips may be LED chips respectively emitting different colors.

Further, neighboring openings of the plurality of openings may be partitioned from each other by at least one partition, the plurality of openings may be further provided with phosphors to be filled therein, and an upper cross-sectional area of a first opening of the plurality of openings may be different from an upper cross-sectional area of a second opening of the plurality of openings.

Further, the first opening may be filled with a phosphor having a first color temperature, and the second opening may have an upper cross-sectional area greater than the first opening and may be filled with a phosphor having a second color temperature different from the first color temperature.

Further, the LED chip located at the first opening may be applied with a first voltage or current, and the LED chip located at the second opening may be applied with a second voltage or current different from the first voltage or current.

Further, the upper cross-sectional shape of the first opening of the plurality of openings may be formed to include an arc and a straight line connecting opposite ends of the arc, the upper cross-section shape of the second opening of the plurality of openings may be formed to include a pair of arcs facing each other and a pair of straight lines connecting opposite ends of the arcs and being parallel to each other, the first opening and the second opening may be partitioned by the partitions, and the arcs of the first and second openings may have the same curvature.

Further, the electrode portions may include a plurality of LED chip connection pads on which the LED chips are respectively disposed and a plurality of wire connection pads electrically connected with the LED chip connection pads through the LED chips, any one of the plurality of openings may have a portion of one LED chip connection pad and a portion of one wire connection pad disposed therein, and an extension length of the LED chip connection pad or the wire connection pad arranged in any one of the plurality of openings may be different from an extension length of the LED chip connection pad or the wire connection pad arranged in another opening of the plurality of openings.

Further, the electrode portions may include a plurality of first electrode pads and a single second electrode pad electrically connected with the first electrode pads via the LED chips.

Further, neighboring openings of the plurality of openings may be partitioned from each other by partitions, the partitions may be provided to be a plurality of partitions, some of which are mutually intersected, and at least one partition of the plurality of partitions may be arranged on the upper surface of the second electrode pad in a longitudinal direction of the second electrode pad.

Further, an upper cross-sectional area of the opening may be formed to be larger than a lower cross-sectional area of the opening.

In addition, the LED package may further include: a plurality of heat dissipating pads connected with the electrode portions and arranged on a lower surface of the package mold portion, and terminal portions arranged between the heat dissipating pads and the electrode portions to electrically connect the heat dissipating pads and the electrode portions.

Further, the terminal portions may protrude outward from the side edges of the package mold portion.

As described above, according to the embodiments of the present disclosure, it is possible to achieve the above disclosed challenge of the present disclosure. Specifically, the LED package according to the present disclosure may be configured to include a plurality of LED chips; a plurality of electrode portions on which the plurality of LED chips are mounted, respectively; and a package mold portion having a plurality of openings formed on one surface thereof so as to emit light by the plurality of LED chips, thereby providing a plurality of light emitting regions.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE INVENTION

Figure 1:
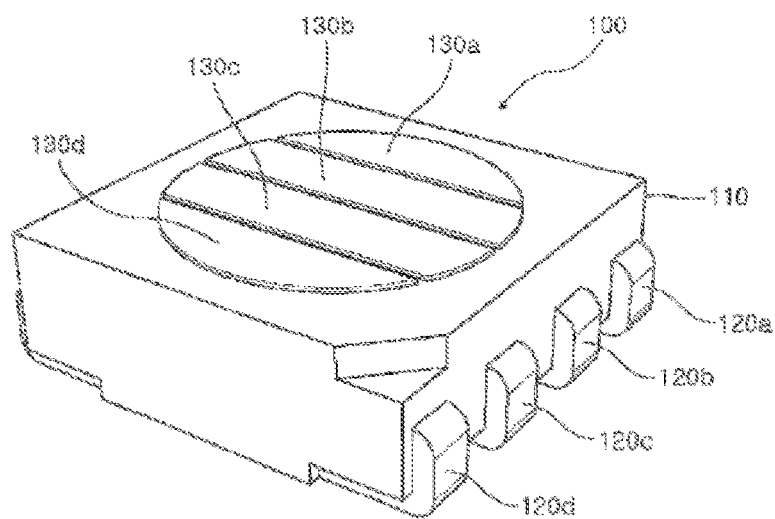
FIG. 1 is a perspective view illustrating an LED package according to an embodiment of the present disclosure.
Figure 2:
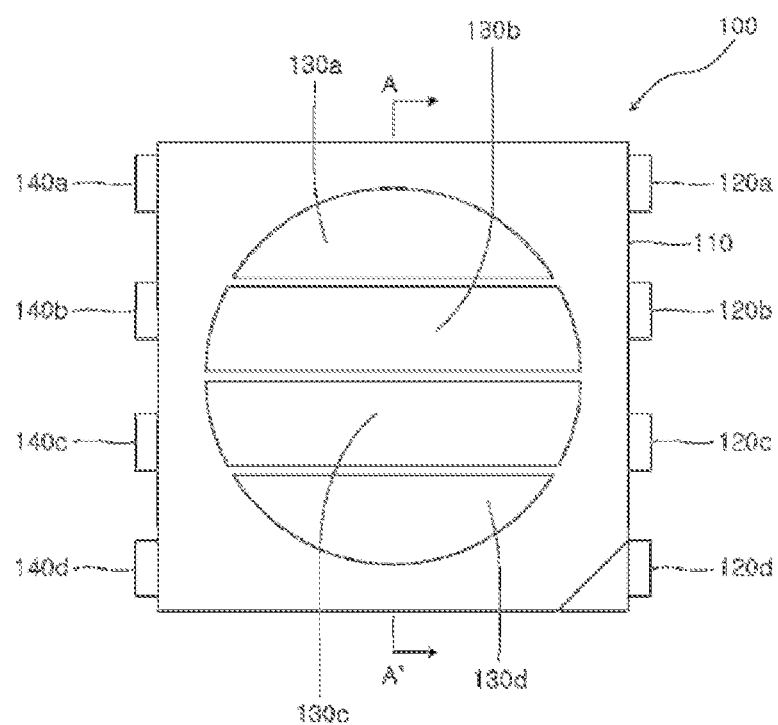
FIG. 2 is a plan view illustrating the LED package shown in FIG. 1.
Figure 3:
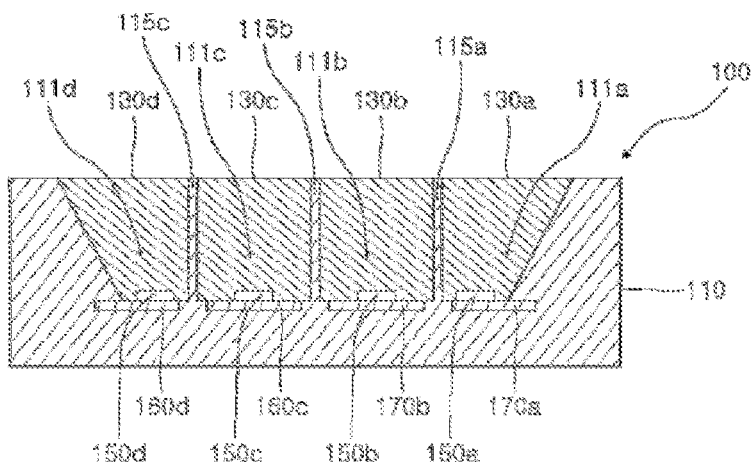
FIG. 3 is a cross-sectional view taken along a line III-III of the LED package shown in FIG. 2.
Figure 4:
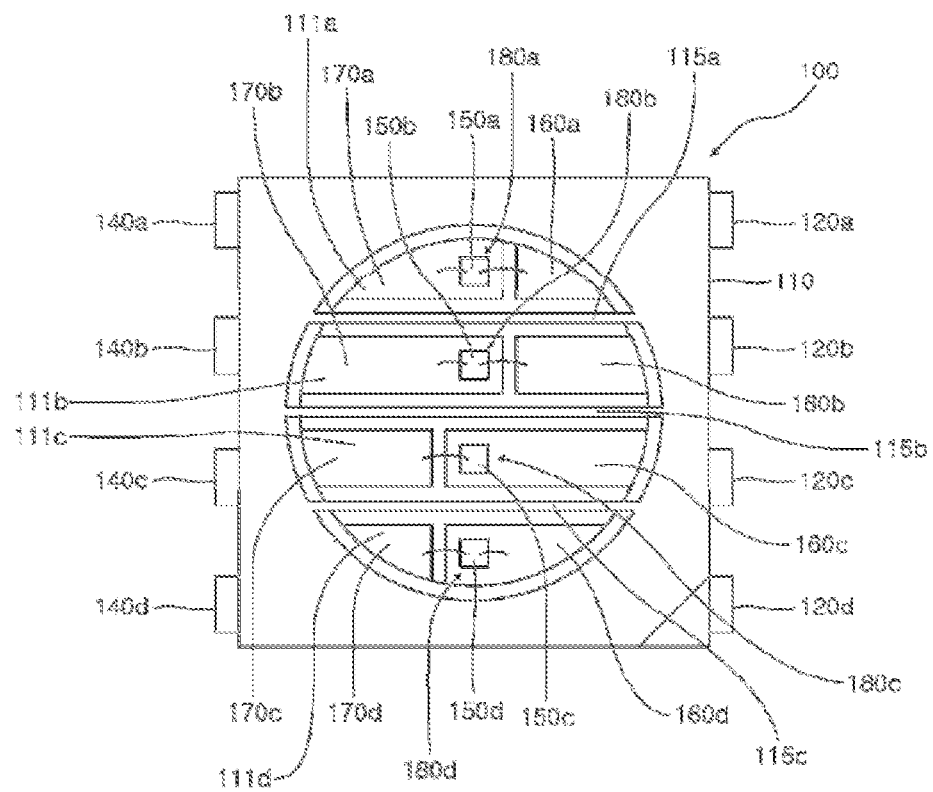
FIG. 4 is a plan view illustrating the LED package in which phosphors are removed from FIG. 2.

Hereinafter, embodiments of the present disclosure will be described in detail with reference to the accompanying drawings so that those skilled in the art can easily carry out the present disclosure. The present disclosure may be embodied in many different forms and is not limited to the embodiments described herein. In the drawings, in order to clearly explain the present disclosure, parts that are not related to the description are omitted, and the same or similar components are denoted by the same reference numerals throughout the specification. In addition, since the sizes and thicknesses of the components shown in the drawings are arbitrarily shown for convenience of explanation, the present disclosure is not necessarily limited to those shown in the drawings In the present disclosure, the term "on" means that an object member is located above or below the object member, and does not necessarily mean that the object is located at an upper position with respect to the gravitational direction. Also, when portions are referred to as "including" an element throughout the specification, it means that the portions may include other elements as well, without excluding other elements unless specifically explained otherwise.

Hereinafter, the configuration and operation of embodiments of the present disclosure will be described in detail with reference to the drawings.

FIGS. 1 to 4 illustrate a LED package according to one embodiment of the present disclosure. Referring to FIGS. 1 to 4, the LED package 100 includes a plurality of LED chips 150a, 150b, 150c, and 150d; a plurality of electrode portions 180a, 180b, 180c, and 180d on which the plurality of LED chips 150a, 150b, 150c, and 150d are mounded, respectively; a plurality of terminal portions 120a 120b, 120c, 120d, 140a, 140b, 140c, and 140d connected with the plurality of electrode portions 180a, 180b, 180c, and 180d; a package mold portion 110 which partitions a light emitting region by each of the plurality of LED chips 150a, 150b, 150c and 150d; and a plurality of phosphors 130a, 130b, 130c, and 130d corresponding to the plurality of LED chips 150a, 150b, 150c, and 150d, respectively.

The plurality of LED chips 150a, 150b, 150c, and 150d is comprised of a first LED chip 150a of a blue LED chip, a second LED chip 150b of a green LED chip, a third LED chip 150c of a red LED chip, and a fourth LED chip 150d of a blue LED chip. Each of the LED chips 150a, 150b, 150c, and 150d is mounted on its corresponding electrode portions 180a, 180b, 180c, and 180d, respectively. In this embodiment, it is described that the first LED chip 150a may be a blue LED chip, the second LED chip 150b may be a green LED chip, the third LED chip 150c may be a red LED chip, and the fourth LED chip 150d may be a blue LED chip. However, the present disclosure is not limited thereto and various combinations of the same or different types of the LED chips may be used. While this embodiment describes four LED chips, the present disclosure is not limited thereof and two, three, and five or more LED chips may be used.

The plurality of electrode portions 180a, 180b, 180c, and 180d includes a first electrode portion 180a on which the first LED chip 150a is mounted; a second electrode portion 180b on which the second LED chip 150b is mounted; a third electrode portion 180c on which the third LED chip 150c is mounded; and a fourth electrode portion 180d on which the fourth LED chip 150d is mounted.

In the LED package according to this embodiment, the electrode portions 180a, 180b, 180c and 180d may be illustratively a lead frame, but this is only an exemplary configuration and may include any configurations that can be electrically connected The first electrode portion 180a includes a first LED chip connection pad 170a to which the first LED chip 150a is bonded, and a first LED chip wire connection pad 160a connected with the first LED chip 150a through a bonding wire.

The second electrode portion 180b includes a second LED chip connection pad 170b to which the second LED chip 150b is bonded, and a second LED chip wire connection pad 160b connected with the second LED chip 150b through a bonding wire.

The third electrode portion 180c includes a third LED chip connection pad 160c to which the third LED chip 150c is bonded, and a third LED chip wire connection pad 170c connected with the third LED chip 150c through a bonding wire.

The fourth electrode portion 180d includes a fourth LED chip connection pad 160d to which the fourth LED chip 150d is bonded, and a fourth LED chip wire connection pad 170d connected with the fourth LED chip 150d through a bonding wire.

The plurality of terminal portions 120a, 120b, 120c, 120d; and 140a, 140b, 140c, 140d are electrically connected to the plurality of electrode portions 180a, 180b, 180c, and 180d and exposed to both outside of the package mold portion 110. The plurality of terminal portions 120a, 120b, 120c, 120d; and 140a, 140b, 140c, 140d include a first A terminal portion 120a connected with the first LED chip wire connection pad 160a, a second A terminal portion 120b connected with the second LED chip wire connection pad 160b, a third A terminal portion 120c connected with the third LED chip connection pad 160c, a fourth A terminal portion 120d connected with the fourth LED chip connection pad 160d; a first B terminal portion 140a connected with the first LED chip connection pad 170a, a second B terminal portion 140b connected with the second LED chip connection pad 170b, a third B terminal portion 140c connected with the third LED chip wire connection pad 170c, and a fourth B terminal portion 140d connected with the fourth LED chip wire connection pad 170d.

The package mold portion 110 includes a plurality of openings 111a, 111b, 111c, and 111d formed on one surface (the upper surface in the drawings) so as to radiate light by the plurality of LED chips 150a, 150b, 150c, and 150d. The plurality of openings 111a, 111b, 111c and 111d include a first opening 111a for radiating light by the first LED chip 150a, a second opening 111b for radiating light by the second LED chip 150b, a third opening 111c for radiating light by the third LED chip 150c and a fourth opening 111d for radiating light by the fourth LED chip 150d. The plurality of openings 111a, 111b, 111c and 111d are arranged in parallel, and the neighboring openings are partitioned from each other by a plurality of partitions 115a, 115b and 115c.

The plurality of partitions 115a, 115b, 115c include a first partition 115a for separating the first opening 111a and the second opening 111b, a second partition 115b for separating the second opening 111b and the third opening 111c, and a third partition 115c for partitioning the third opening 111c and the fourth opening 111d.

The plurality of openings 111a, 111b, 111c, and 111d are formed to be filled with phosphors. In this embodiment, it is described that the plane shapes formed by plurality of openings 111a, 111b, 111c and 111d are circular as shown in the drawings, but may be various shapes including polygons such as a triangle, a rectangle, and a pentagon.

According to this embodiment, the openings of the LED package 100 may be arranged in the order of the first opening 111a, the second opening 111b, the third opening 111c, and the fourth opening 111d.

An upper cross-sectional shape of the first opening 111a is formed to include an arc and a straight line connecting both ends of the arc.

An upper cross-section shape of the second opening 111b is formed to include a pair of arcs facing each other and a pair of straight lines connecting both ends of the arcs and being parallel to each other Moreover, the arcs of the first opening 111a and the second opening 111b may be formed to have the same curvature.

In addition, an upper cross-section shape of the fourth opening 111d is formed to be symmetrical with that of the first opening 111a, and an upper cross-section shape of the third opening 111c is formed to be symmetrical with that of the second opening 111b.

Consequently, in a state where the first to fourth openings 111a to 111d are arranged in the package mold portion 110, a shape where the upper cross-section shapes of the first to fourth openings 111a to 111d are arranged may be formed to have a substantially concentric shape.

The edge portions of the upper cross-sectional shapes of the first to fourth openings 111a to 111d are formed to have arc shapes, such that the light emitted from the LED chips 150a, 150b, 150c and 150d arranged in the first to fourth openings 111a to 111d may be more uniform and may be diverted to the outside from the first to fourth openings 111a to 111d in a state where the interference is suppressed.

In addition, the upper cross-sectional areas of the first to fourth openings 111a to 111d may be formed to be larger than the lower cross-sectional areas of the first to fourth openings 111a to 111d. In other words, the inner walls of the package mold 110 which are in contacted with the first to fourth openings 111a to 111d may be formed to be tilted outward as it goes upward.

Therefore, the light emitted from the LED chips 150a, 150b, 150c and 150d each arranged under the first to fourth openings 111a to 111d may be smoothly emitted upward.

In the LED package 100 according to the embodiment, the upper cross-sectional areas of the first and fourth openings 111a and 111d are formed to have a first area, whereas the upper cross-sectional areas of the second and third openings 111b and 111c are formed to have a second area. The first area may be different from the second area. As an example, the second area may be formed to be larger than the first area.

That is, the first opening 111a and the second opening 111b adjacent to each other may be formed to have different upper cross-sectional areas.

Meanwhile, the plurality of phosphors 130a, 130b, 130c and 130d may include a first phosphor 130a filled in the first opening 111a, a second phosphor 130b filled in the second opening 111b, a third phosphor 130c filled in the third opening 111c, and a fourth phosphor 130d filled in the fourth opening 111d. In this embodiment, it will be described that the fourth phosphor 130d can be interacted with the fourth LED chip 150d of the blue LED chip so as to emit white light.

According to the above-described configuration, the blue light is emitted from the first light emitting region formed by corresponding to the first phosphor 130a, green light is emitted from the second light emitting region formed by corresponding to the second phosphor 130a, red light is emitted from the third light emitting region formed by corresponding to the third phosphor 130c, and white light is emitted from the fourth light emitting region formed by corresponding to the fourth phosphor 130d. However, the present disclosure is not limited to the forgoing, and may be modified to other light emitting type, which also falls within the scope of the present disclosure, for example, as follow:

First, two or more regions may be configured to emit white light such as in the fourth light emitting region.

Second, all regions may be configured as chips for emitting a single color (for example, blue LED chips), and configured to emit different colors depending on the corresponding phosphors.

Third, white light phosphors based on a blue LED chip having correlated color temperature (CCT) range may be arranged in each of light emitting regions. In this case, the correlated color temperature (CCT) range of the white light phosphor based on the blue LED chip may be in range from 1,800 K to 20,000 K, regardless of the specific phosphors used for emitting white light and the specific combination ratio thereof.

As described above, the first and second openings 111a and 111d and the second and third opening 111b and 111c have different upper cross-sectional areas. In addition, for example, the first opening 111a may be filled with the first phosphor 130a having the first color temperature, and the opening 111b may be filled with the second phosphor 130b having a second color temperature.

In this case, the second color temperature may be formed to be smaller than the first color temperature. Accordingly, when the color temperature is low, since the optical attenuation is greater than when the color temperature is high, the optical attenuation can be compensated by arranging the second phosphor 130b having a lower color temperature on the second opening 111b having a larger upper cross-sectional area.

Meanwhile, different voltage or currents may be applied to the first to fourth LED chips 150a to 150d respectively arranged in the first to fourth openings 111a to 111d.

As an example, a first voltage or current may be applied to the first LED chip 150a arranged in the first opening 111a, and a second voltage or current different from the first voltage or current may be applied to the second LED chip 150b arranged in the second opening 111b having the upper cross sectional area of the second opening 111b larger than that of the first opening 111a. In this case, the second voltage or current may be formed to be larger than the first voltage or current. That is, due to applying a higher e voltage or current to the second LED chip 150b arranged in the second opening 111b in which the upper cross-sectional area for emitting light is relatively larger than that of the first opening 111a, it is possible to suppress a difference in brightness of light emitted from the openings 111a, 111b, 111c, and 111d having different areas.

Hereinafter, other embodiments of the present disclosure will be described.

Figure 5:
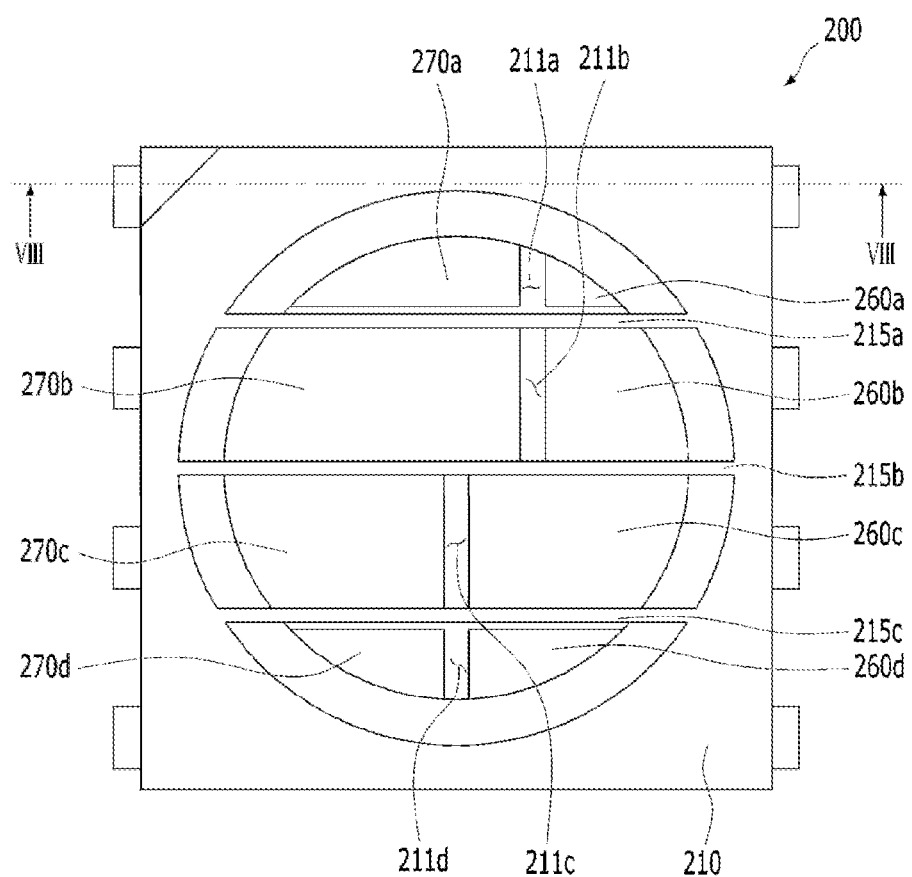
FIG. 5 is a view illustrating an upper surface of an LED package according to another embodiment of the present disclosure.
Figure 6:
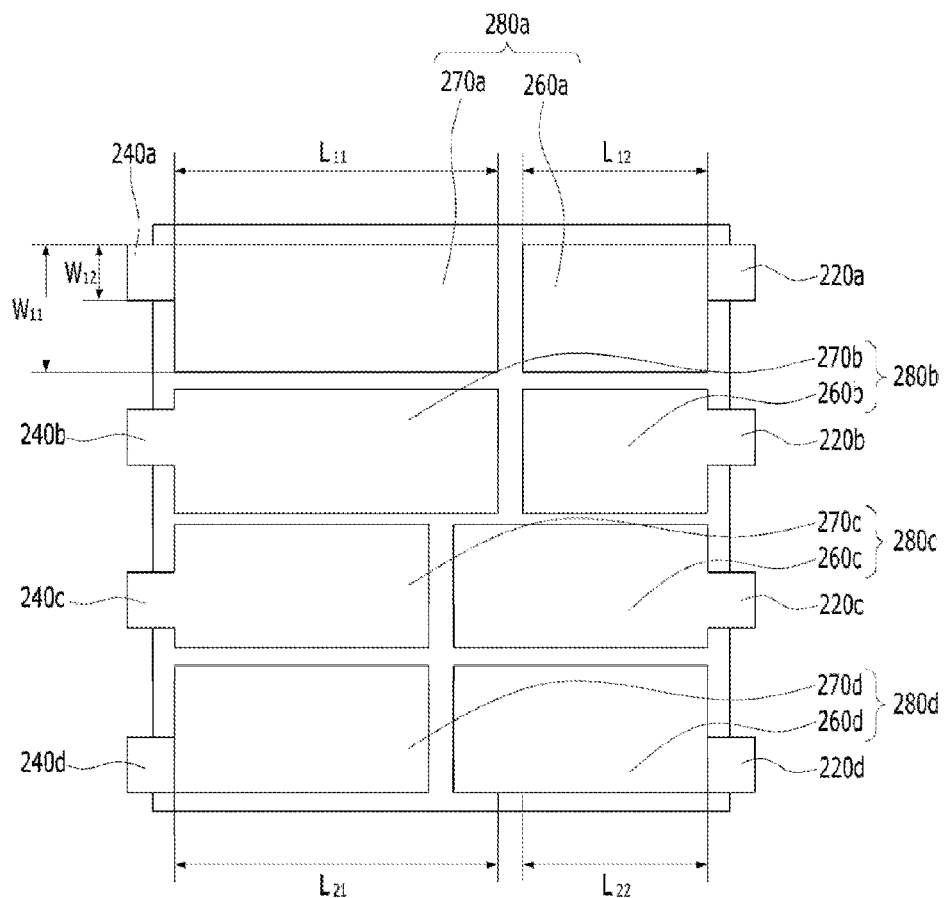
FIG. 6 is a view illustrating a state where a portion of a package mold portion provided on the upper side of the LED package of FIG. 5 is removed.
Figure 7:
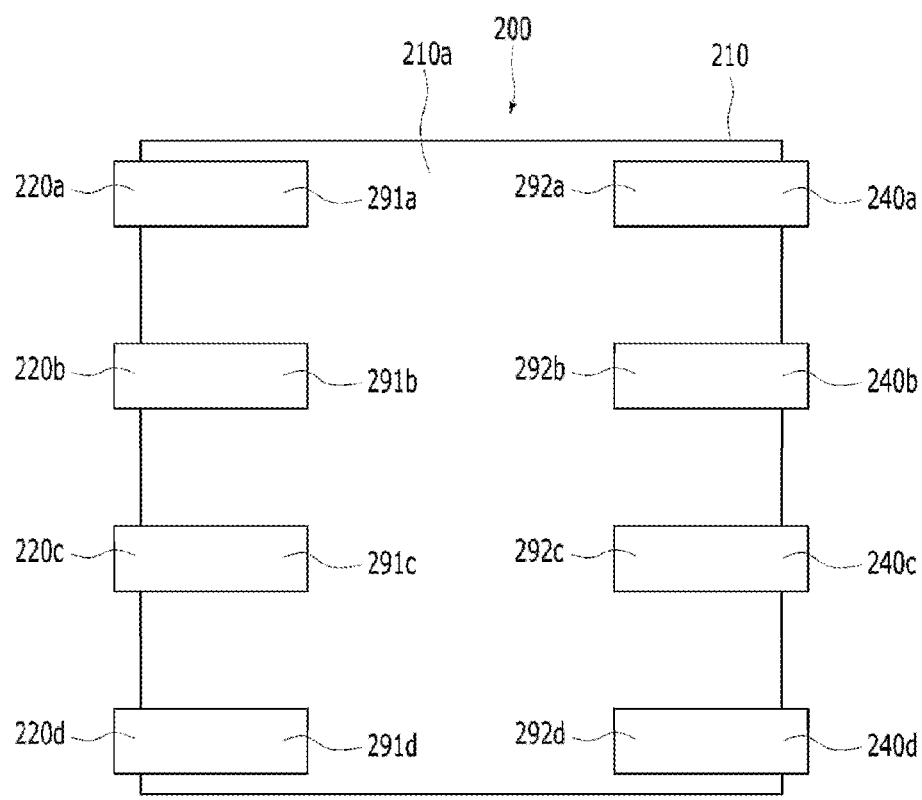
FIG. 7 is a view illustrating a lower surface of the LED package of FIG. 5.
Figure 8:
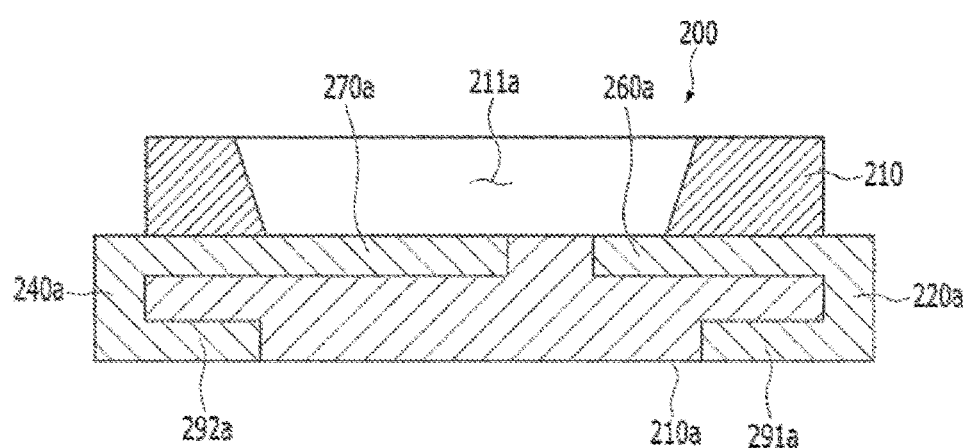
FIG. 8 is a cross-sectional view illustrating the LED package taken along a line VIII-VIII of FIG. 5.

FIG. 5 is a view illustrating an upper surface of an LED package according to another embodiment of the present disclosure; FIG. 6 is a view illustrating a state where a package mold portion provided on the upper side of the LED package of FIG. 5 is removed; FIG. 7 is a view illustrating a lower surface of the LED package of FIG. 5; and FIG. 8 is a cross-sectional view of a portion of the LED package taken along a line VIII-VIII of FIG. 5.

The configuration of this embodiment is substantially the same as that of the LED package described in relation to FIGS. 1 to 4, but there is a difference in the configuration of the electrode portion and the configuration in which the heat radiation pad is added. Accordingly, the following description focuses on the characteristic part of this embodiment.

FIG. 5 shows a state before LED chips and phosphors are arranged in an LED package 200.

Referring to FIGS. 5 to 8, the LED package 200 according to this embodiment includes a package mold portion 210; a plurality of electrode portions 280a, 280b, 280c, and 280d; a plurality of terminal portions 220a, 220b, 220c, 220d, 240a, 240b, 240c, and 240d electrically connected with the electrode portions 280a, 280b, 280c, and 280d; and a plurality of heat dissipating pads 291a, 291b, 291c, 291d, 292a, 292b, 292c, and 292d connected with the terminal portions 220a, 220b, 220c, 220d, 240a, 240b, 240c, and 240d.

The electrode portions 280a, 280b, 280c, and 280d may include LED chip connection pads 270a, 270b, 270c, and 270d and wire connection pads 260a, 260b, 260c, and 260d, respectively.

The portions of the LED chip connection pads 270a, 270b, 270c, and 270d and the wire connection pads 260a, 260b, 260c, and 260d are respectively arranged in the opening 211a, 211b, 211c and 211d.

The openings 211a, 211b, 211c, and 211d are respectively partitioned by a plurality of partitions 215a, 215b, and 215c.

According to this embodiment, the first to fourth LED chip connection pads 270a to 270d are arranged in the same column and formed to be extended in a direction parallel to each other. Similarly, the first to fourth wire connection pads 260a to 260d are also arranged in the same column and formed to be extended in a direction parallel to each other.

An extension length $L_{11}$ of the first and second LED chip connection pads 270a and 270b arranged in the first and second openings 211a and 211b is formed to be larger than an extension length $L_{21}$ of the third and fourth LED chip connection pads 270c and 270d arranged in the third and fourth openings 211c and 211d.

In addition, an extension length $L_{12}$ of the first and second wire connection pads 260a and 260b arranged in the first and second opening 211a and 211b is formed to be smaller than an extension length $L_{22}$ of the third and fourth wire connection pads 260c and 260d arranged in the third and fourth openings 211c and 211d.

In this case, distances spaced apart from each other between the LED chip connection pads 270a, 270b, 270c and 270d and the wire connection pads 260a, 260b, 260c and 260d are formed to have the same distance.

Accordingly, a space between the first LED chip connection pad 270a and the first wire connection pad 260a and a space between the second LED chip connection pad 270b and the second wire connection pad 260b are arranged to be misaligned with a space between the third LED chip connection pad 270c and the third wire connection pad 260c and a space between the fourth LED chip connection pad 270d and the fourth wire connection pad 260d.

In other words, the spaces between the LED chip connection pads 270a, 270b, 270c, and 270d and the wire connection pads 260a, 260b, 260c, and 260d arranged on the package mold portion 210 are formed to be not located in the same column. As the spaces are located in the same column, it is possible to suppress the damage of the package mold portion 210 caused by the stress concentration, and it is also possible to improve the rigidity of the package mold portion 210.

Meanwhile, the heat dissipating pads 291a, 291b, 291c, 291d, 292a, 292b, 292c, and 292d is arranged on the lower surface 210a of the package mold portion 210 and connected with the terminal portions 220a, 220b, 220c, 220d, 240a, 240b, 240c, and 240d, thereby being electrically connected with the plurality of electrode portions 280a, 280b, 280c, and 280d.

In a state where the LED package 200 according this embodiment is mounted on an external substrate, the terminal portions 220a, 220b, 220c, 220d, 240a, 240b, 240c, and 240d and the heat dissipating pads 291a, 291b, 291c, 291d, 292a, 292b, 292c, and 292d of the LED package 200 are connected with metal electrodes of the substrate.

That is, the electrode portions 280a, 280b, 280c, and 280d, the terminal portions 220a, 220b, 220c, 220d, 240a, 240b, 240c, and 240d, and the heat dissipating pads 291a, 291b, 291c, 291d, 292a, 292b, 292c, and 292d are made of metal materials and physically connected with each other, such that the heat generated during the driving process of the LED chip can be smoothly discharged from the electrode portions 280a, 280b, 280c, and 280d to the heat dissipating pads 291a, 291b, 291c, 291d, 292a, 292b, 292c, and 292d. The terminal portions 220a, 220b, 220c, 220d, 240a, 240b, 240c, and 240d protrude outward from the side edges of the package mold portion 210. And, the widths $W_{12}$ of the terminal portions 220a, 220b, 220c, 220d, 240a, 240b, 240c, and 240d are formed to be smaller than the widths $W_{11}$ of the terminal portions 280a, 280b, 280c, and 280d connected with the terminal portions 220a, 220b, 220c, 220d, 240a, 240b, 240c, and 240d.

Figure 9:
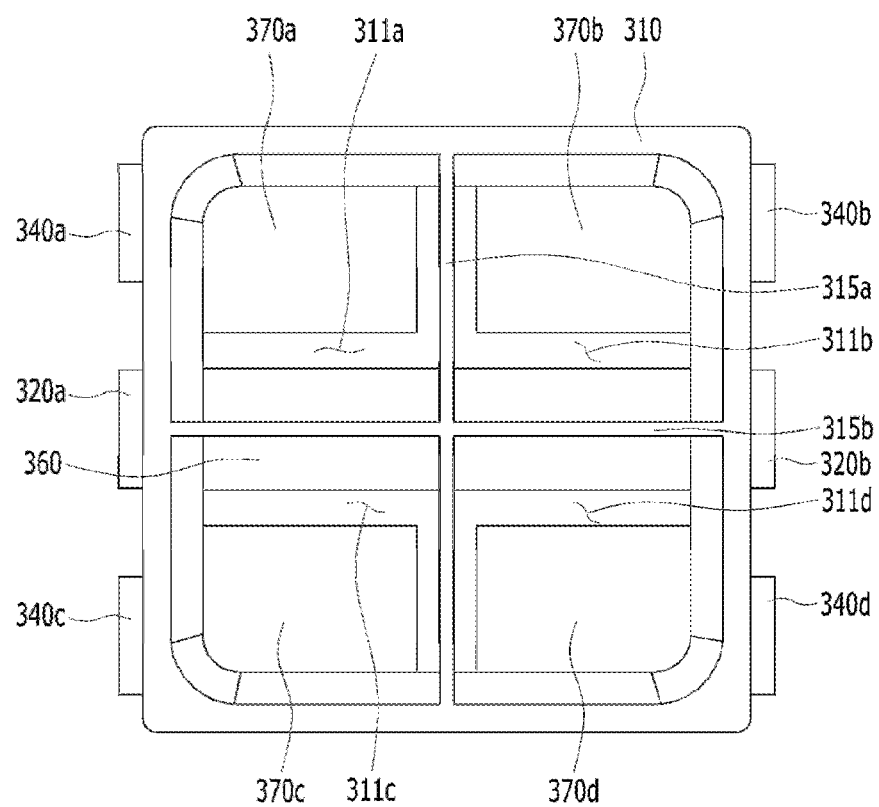
FIG. 9 is a view illustrating an upper surface of an LED package according to still another embodiment of the present disclosure.
Figure 10:
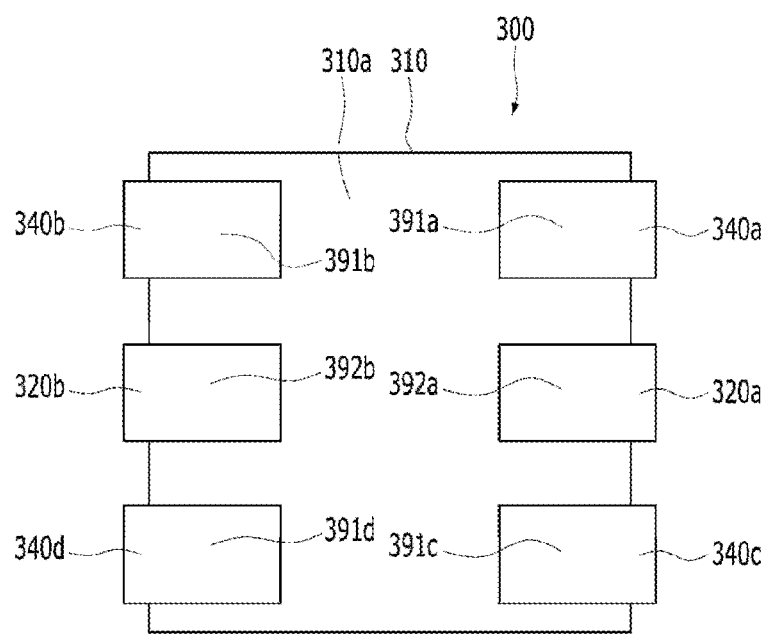
FIG. 10 is a view illustrating a lower surface of the LED package according to the embodiment of FIG. 9.

FIG. 9 is a view illustrating an upper surface of an LED package according to still another embodiment of the present disclosure; and FIG. 10 is a view illustrating a lower surface of the LED package according to the embodiment of FIG. 9.

The configuration of this embodiment is substantially the same as that of the LED package described in FIGS. 1 to 5, but there is a difference in the configurations of the electrode portions and the openings. Accordingly, the following description focuses on the characteristic part of this embodiment.

FIG. 9 shows a state before LED chips and phosphors are arranged in an LED package 300.

Referring to FIGS. 9 and 10, the LED package 300 according to the embodiment include a package mold portion 310, a plurality of first electrode pads 370a, 370b, 370c, and 370d and a single second electrode pad 360 electrically connected with the first electrode pads 370a, 370b, 370c, and 370d via the LED chips.

That is, the second electrode pad 360 of the LED package 300 according to this embodiment is provided as a common electrode.

In this case, the LED chip is arranged on either of the first electrode pads 370a, 370b, 370c and 370d or the second electrode pad 360 depending on the shape.

The mold portion 310 is formed with a plurality of openings 311a, 311b, 311c, and 311d having the same rectangular shape, and first and second partitions 315a and 315b for partitioning a plurality of openings 311a, 311b, 311c, and 311d in both of a perpendicular direction and a horizontal direction.

A portion of one of the first electrode pads 370a, 370b, 370c and 370d and a portion of the second electrode pad 360 are disposed in the openings 311a, 311b, 311c and 311d in a state where the portions are spaced apart from each other.

In this case, the second partition 315b extended and formed in the horizontal direction is arranged on the upper surface of the second electrode pad 360 in the longitudinal direction of the second electrode pad 360.

The first electrode pads 370a, 370b, 370c, and 370d are connected with the first terminal portions 340a, 340b, 340c, and 340d, respectively, and opposite ends of the second electrode pad 360 are connected with the second terminal portions 320a and 320b.

The first terminal portions 340a, 340b, 340c, and 340d and the second terminal portions 320a and 320b may be connected with either of a driving voltage or a source voltage. For example, when the first terminal portions 340a, 340b, 340c, and 340d are connected with the driving voltage, the second terminal portions 320a and 320b is connected with the source voltage. When the first terminal portions 340a, 340b, 340c and 340d are connected with the source voltage, the second terminal portions 320a and 320b is connected with the driving voltage.

In addition, the first terminal portions 340a, 340b, 340c, and 340d may be applied with different voltage or currents, but the second terminal portions 320a and 320b are applied with the same voltage or current.

While this embodiment describes that the openings 311a, 311b, 311c and 311d are formed in a rectangular shape, the openings may be formed in a polygonal or circular shape other than the rectangular shape. Such a configuration is also fall in an embodiment of the present disclosure. This embodiment has an advantage that the design of the electrode portions can be simplified, even if the plurality of LED chips are mounted on a single LED package.

Although the present disclosure has been described in the above embodiments, the embodiments of the present disclosure are not limited thereto. These embodiments may be modified or changed without departing from the spirit and scope of the present disclosure, and those of ordinary skill in the art will recognize that such modifications and variations are also within the scope of the present disclosure.

The invention claimed is:

1. An LED package comprising:
a plurality of LED chips;
a plurality of electrode portions on which the plurality of LED chips is respectively mounted;
a package mold portion having a plurality of openings formed on one surface thereof so as to radiate light of the plurality of LED chips; and
phosphors filled in the plurality of openings.

2. The LED package of claim 1, wherein the plurality of openings are arranged in parallel and the neighboring openings are partitioned from each other by at least one partition; and
wherein the plurality of openings are formed in planar shapes which are circular or polygonal.

3. The LED package of claim 1, wherein the plurality of LED chips include a first LED chip which is a blue LED chip, a second LED chip which is a green LED chip, a third LED chip which is a red LED chip, and a fourth LED chip which is a blue LED chip.

4. The LED package of claim 3, further comprising phosphors filled in the plurality of openings, wherein the phosphor corresponding to the fourth LED chip emits white light of a color temperature range of 1,800 K to 20,000 K.

5. The LED package of to claim 1, wherein:
the plurality of LED chips are configured to emit a single color,
or
at least two of the plurality of LED chips are LED chips respectively emitting different colors.

6. The LED package of claim 1, wherein neighboring openings of the plurality of openings are partitioned from each other by at least one partition;
the plurality of openings are further provided with phosphors to be filled therein; and an upper cross-sectional area of a first opening of the plurality of openings is different from an upper cross-sectional area of a second opening of the plurality of openings.

7. The LED package of claim 6, wherein the first opening is filled with a phosphor having a first color temperature, and
the second opening has an upper cross-sectional area greater than the first opening and is filled with a phosphor having a second color temperature different from the first color temperature.

8. The LED package of claim 6, wherein the LED chip located at the first opening is applied with a first voltage or current, and the LED chip located at the second opening is applied with a second voltage or current different from the first voltage or current.

9. The LED package of claim 6, wherein the upper cross-sectional shape of the first opening of the plurality of openings is formed to include an arc and a straight line connecting opposite ends of the arc;
the upper cross-section shape of the second opening of the plurality of openings is formed to include a pair of arcs facing each other and a pair of straight lines connecting opposite ends of the arcs and being parallel to each other; and the first opening and the second opening are partitioned by the partitions, and the arcs of the first and second openings have the same curvature.

10. The LED package according to claim 1, wherein the electrode portions include a plurality of LED chip connection pads on which the LED chips are respectively disposed, and a plurality of wire connection pads electrically connected with the LED chip connection pads through the LED chips;

any one of the plurality of openings has a portion of one LED chip connection pad and a portion of one wire connection pad disposed therein; and an extension length of the LED chip connection pad or the wire connection pad arranged in any one of the plurality of openings is different from an extension length of the LED chip connection pad or the wire connection pad arranged in another opening of the plurality of openings.

11. The LED package of claim 1, wherein the electrode portions include a plurality of first electrode pads and a single second electrode pad electrically connected with the first electrode pads via the LED chips.

12. The LED package of claim 11, wherein neighboring openings of the plurality of openings are partitioned from each other by partitions;

the partitions are provided to be a plurality of partitions, some of which are mutually intersected; and at least one partition of the plurality of partitions is arranged on the upper surface of the second electrode pad in a longitudinal direction of the second electrode pad.

13. The LED package of claim 1, wherein an upper cross-sectional area of the opening is formed to be larger than a lower cross-sectional area of the opening.

14. The LED package of claim 1, further comprising:

a plurality of heat dissipating pads connected with the electrode portions and arranged on a lower surface of the package mold portion; and terminal portions arranged between the heat dissipating pads and the electrode portions to electrically connect the heat dissipating pads and the electrode portions.

15. The LED package of claim 14, wherein the terminal portions protrude outward from the side edges of the package mold portion.

* * * * *